(12) United States Patent
Greaves et al.

(10) Patent No.: US 7,478,350 B2
(45) Date of Patent: Jan. 13, 2009

(54) MODEL MODIFICATION METHOD FOR TIMING INTEROPERABILITY FOR SIMULATING HARDWARE

(75) Inventors: David J. Greaves, Cambridge (GB); Daryl Stewart, Cambridge (GB)

(73) Assignee: ARC International (UK) Limited, Saint Albans (GB)

( * ) Notice: Subject to any disclaimer, the term of this patent is extended or adjusted under 35 U.S.C. 154(b) by 191 days.

(21) Appl. No.: 11/328,926

(22) Filed: Jan. 9, 2006

(65) Prior Publication Data

US 2007/0033551 A1 Feb. 8, 2007

Related U.S. Application Data

(60) Provisional application No. 60/647,650, filed on Jan. 27, 2005.

(51) Int. Cl.
*G06F 17/50* (2006.01)

(52) U.S. Cl. .................................. 716/6; 716/3; 716/18

(58) Field of Classification Search ...................... 716/1, 716/3–6, 18; 717/100, 104, 108, 122, 136, 717/137
See application file for complete search history.

(56) References Cited

U.S. PATENT DOCUMENTS

| 6,606,734 B2 * | 8/2003 | Greaves ........................ 716/4 |
| 2004/0216093 A1 * | 10/2004 | Kawakatsu .................. 717/136 |

* cited by examiner

*Primary Examiner*—Vuthe Siek
(74) *Attorney, Agent, or Firm*—Ropes & Gray LLP

(57) ABSTRACT

Integrated circuit design often involves combination of blocks of circuit from different sources to create new designs. However, a simulation of a block developed using a given method may not be compatible with another simulation created using another method. A method for modifying hardware simulation having one internal timing regime to enable interoperation with another simulation having a different internal timing regime is described. In particular, it involves modification of models in a domain in which variables are used so that they are interoperable with models in a domain using signals.

20 Claims, 7 Drawing Sheets

MODEL MODIFICATION METHOD FOR TIMING INTEROPERABILITY FOR SIMULATING HARDWARE

This application is the nonprovisional filing of Provisional Application No. 60/647,650, filed Jan. 27, 2005.

REFERENCE TO COMPUTER PROGRAM APPENDIX

Filed herewith are two identical discs which are hereby incorporated by reference, each containing a product release of a program embodying the present invention for use on an x86 processor running Linux RedHat 7.3 or 8.0, with GCC Version 3.2 or later. Each disc contains the following files created on Jan. 7, 2005:

| Filename | Size (in bytes) |
| --- | --- |
| VTOC-2-2-Generate.pdf | 392019 |
| VTOC-2-2-Start.pdf | 242273 |
| VTOC-2-2-Runtime.pdf | 373328 |
| vtoc/vtocinit.sh | 1148 |
| vtoc/vtocinit.csh | 1112 |
| vtoc/vtoc-version.txt | 4221 |
| vtoc/lib/vtoclibs/vtoc__tenos.h | 191 |
| vtoc/lib/vtoclibs/ttvtocsys.h | 3538 |
| vtoc/lib/vtoclibs/ttvtocpli.h | 3615 |
| vtoc/lib/vtoclibs/ttvtoclib__all__cpp.cpp | 816 |
| vtoc/lib/vtoclibs/ttvtoclib__all.cpp | 1038 |
| vtoc/lib/vtoclibs/ttvtoclib__all.c | 1079 |
| vtoc/lib/vtoclibs/ttvtoc.h | 50916 |
| vtoc/lib/vtoclibs/tt__sysc.h | 3056 |
| vtoc/lib/vtoclibs/tt__libsyms.o | 5848 |
| vtoc/lib/vtoclibs/tt__libexports | 1710 |
| vtoc/lib/vtoclibs/libvtoc__readline.a | 1376064 |
| vtoc/lib/vtoclibs/libvtoc.a | 1374404 |
| vtoc/lib/vtoclibs/gcc-2.95-tt__sysc.o | 6016 |
| vtoc/lib/vtoclibs/cxctypes.h | 188 |
| vtoc/lib/vtoclibs/cxcpptypes.h | 192 |
| vtoc/lib/test/test1wrapper.cpp | 1316 |
| vtoc/lib/test/test1wrapper.c | 395 |
| vtoc/lib/test/test1.v | 242 |
| vtoc/lib/test/runmain__sysc.cpp | 2062 |
| vtoc/lib/test/runmain.cv | 1196 |
| vtoc/lib/test/primes.v | 2940 |
| vtoc/lib/test/makefile__win | 2754 |
| vtoc/lib/test/makefile__mmake | 1128 |
| vtoc/lib/test/makefile | 6488 |
| vtoc/lib/test/make__ncsystemc.depends | 45 |
| vtoc/lib/test/make__ncsystemc | 5050 |
| vtoc/lib/test/README.txt | 6489 |
| vtoc/lib/test/PRIMES__ncsystemc.cv | 476 |
| vtoc/lib/test/PRIMES__ncsystemc.cpp | 56 |
| vtoc/lib/test/busshim/makefile | 1055 |
| vtoc/lib/test/busshim/example2__driver.cpp | 1386 |
| vtoc/lib/test/busshim/example2.v | 1837 |
| vtoc/lib/test/busshim/example1__driver.cpp | 1175 |
| vtoc/lib/test/busshim/example1.v | 1237 |
| vtoc/lib/test/busshim/busshim.html | 7588 |
| vtoc/lib/test/busshim/busshim.h | 4827 |
| vtoc/lib/test/busshim/busshim.gif | 7592 |
| vtoc/lib/test/busshim/busshim.cpp | 8850 |
| vtoc/lib/sml/vtoc__setup.sml | 10942 |
| vtoc/lib/sml/cwords.sml | 5099 |
| vtoc/bin/vtoc-c | 8265872 |
| vtoc/bin/vtoc | 8265872 |

FIELD OF INVENTION

The present invention relates to the conversion of a hardware description computer language to an alternative programming language. More particularly, the invention concerns the modification of a hardware simulation having one internal timing regime to enable interoperation with another simulation having a different internal timing regime.

Techniques described in U.S. Pat. No. 6,606,734 and U.S. Patent Application No. 60/558,317 (the "VTOC" method) convert a hardware description of an integrated circuit in a hardware description language (HDL), such as Verilog or VHDL, to an object-oriented programming language such as ANSI C, C++, or Java. VTOC essentially compiles an HDL description of a circuit to a description of the same circuit in C++.

Another tool used for simulation of hardware is Event Driven Simulation ("EDS"). Integrated circuit designers often combine blocks of circuit from different sources to create a new design. However, a simulation of a block developed using the VTOC method will not be compatible with one created using EDS for reasons that will be explained below.

In both VTOC and conventional EDS using VHDL or SystemC, the system to be simulated consists of a number of software component models. Each model can be executed to simulate the behaviour of the corresponding section of hardware. This may be as small as a single gate or it may represent a much larger subsystem, such as a microprocessor or memory array.

A main difference between the two approaches is that VTOC uses variables to represent the interconnection or wires between models whereas VHDL uses signals. FIG. 1 shows a number of component models 2, 4, 6, 8. All interconnection between models is via signals, as would be the case in VHDL. In the Figures, signals are drawn as small boxes with crosses (for example, 10 in FIG. 1) whereas variables are drawn as black ovals (for example, 12 in FIG. 3).

The term "variable" denotes a simple variable supported by a software programming language such as C++. Any model that refers to a variable may read out its current value. The current value is the most recent value written. Signals, as found in VHDL and SystemC are different, in that the values written by a model are not immediately readable by other models. Instead, other models will continue to read the "current value" while writes are stored as "pending updates" to be committed as the current value in a commit phase described below.

EDS Simulation

EDS has been widely used for digital logic modeling on the computer up until now. Under EDS, a model is typically created for each small component of a system and the simulator core maintains one or more event queues to model the interaction of the component models. For digital logic, an event is normally a change of value on a wire or bus of wires (collectively termed a "net"). The individual models can be created in a variety of ways, provided they conform to the general design principles of the EDS simulator.

A single wire net has typically either a logic zero voltage or a logic one voltage, whereas a bus will have a logic zero or one for each of its individual wires. It connects to the output contact of one component, the driver, and feeds a logic value to a number of input contacts on other components.

Certain devices, known collectively as stimulus generators and clocks generate a spontaneous stream of events spaced over time. It is the simulator's job to make sure that each of these events is passed to the components directly affected and also to forward on further events generated by the components in response.

The central data structure of EDS is the event queue. Each event contains a time value for when it should be scheduled, as well as a reference to the net it is to change and the value to be placed on the net. The queue is held in sorted order, so that the earliest available event is always at the head. The operation of EDS is a continuous loop whereby the simulator core removes the first event from this queue and dispatches it by updating the appropriate net.

Each component model has registered with the core a "sensitivity list". This is typically a list of pairs consisting each of a condition and an upcall entry point. When dispatching an event causes a condition on this list to be met, the core must make the upcall into the model. The model may generate future events in response and the core inserts these new at the appropriate point in the event queue. In a well-designed system, ultimately there are fewer of these new events being generated than consumed by the models, and so eventually the event queue empties. No new behaviour happens until one of the spontaneous sources of events next generates a new event.

Verilog, SystemC and VHDL are languages that are implemented directly on top of their own event simulators. All three support the aforementioned signal paradigm of component model interconnection although in Verilog the detailed behaviour is more complex. When a model writes to a signal in a simulation written in one of these languages, this does not immediately affect the current value of the signal, as seen by other models, and equally it is not seen by the part of the core that checks upcall conditions. Instead, the write is stored as a pending update. We assume here that at most one pending update needs to be stored for each signal because features of languages like VHDL that support more than one in the form of a projected output waveform are ignored for RTL (that is, Register Transfer Level or Language) synthesis.

Updates are committed to signals when the core would be about to take an event off the main event queue that has a time value greater than the time value of the last event processed. All updates are committed in one fell swoop without executing any component models mid-way. This is called the "commit phase". If there were some updates pending, then this can cause extended execution at the current simulation time, rather than advancing time. New events for the current time can be generated by the models and this can cause further evaluate and commit phases to occur before time advances. Each of these evaluate and then commit cycles is known as a delta cycle. (The name arises from the mathematical concept of the Dirac delta function where since the time of the event at the head of the event queue is not advancing even though work is being done.)

The signal is used in hardware modeling to enable a processor, that necessarily visits each model in turn, to emulate the behaviour of a section of synchronous hardware where a number of components all operate in unison, such as a set of D-type flip-flops that are clocked from a common clock signal. The evaluate/update cycle ensures that events remain properly synchronized.

This is illustrated by FIG. 2, where a pair of D-type flip-flops 14, 16 must interchange values every active clock edge. Each flip-flop is modeled as a separate software model and they are interconnected using a pair of signals.

On the active edge of the clock, the core will be obliged to make an upcall to both models, and it will do this in an arbitrary order. The first model to be called will read the current output of the other model and write this as a pending update to its own output signal, but owing to the use of signals, the second flip-flop model to be run will not see this new value and it correctly reads the previous output of the first flip-flop to use as it makes a pending update on its own output.

When no further activity can take place in any model without advancing the simulation time, a commit phase occurs and the updates are dispatched. The potential problem avoided is that if one flip-flop updates its output first, the value that others subsequently use for their own updates will be the new value rather than the desired old value. This phenomenon is known by hardware engineers as "shoot through" and occurs in real hardware when the clock signal is not delivered evenly to each sequential circuit owing to wiring delays.

Suitable pseudocode for the implementation of each flip-flop component model is as follows:

```
PROCESS DFF SENSITIVITY=(CLK)
    IF(CLK AND NOT OLD_CLK) Q = D
    OLD_CLK = CLK
ENDPROCESS
```

The use of signals makes the model relatively intuitive. The model is a short, imperative program that is called by the core each time one of the nets it is sensitive to is changed. As can be seen from the first line of the pseudocode, the model is sensitive only to the clock.

The pseudocode contains the sequence "IF (CLK AND NOT OLD_CLK) Q=OLD_D" consists of an assignment that is conditional on an "edge detector". We define the term "edge detector" to be a condition where a signal is logically ANDed with a delayed version of its negation. This structure is used when we wish to detect that a signal has just changed from zero to one: i.e. has had a positive edge. Edge detectors for negative edges are also commonly used.

The timing implications of using signals and pending updates to model sequential logic can be summarized as follows:

1. When a model is called and any clock inputs have changed in their active direction, external inputs that will be changing as a result of that clock edge will still have the un-updated values on their net. (Below, we call these "late" inputs.)
2. When the model is called the new output values become pending updates so that they are not seen by other parts of the EDS until the following delta cycle commit phase.

Using Variables Instead of Signals

A disadvantage of using signals to interconnect each component is that an event can only propagate through one model per delta cycle. For instance, in FIG. 1, an event in model 3 cannot be seen in model 2 until two delta cycles later. This reduces model performance. An alternative to using signals is for models to communicate using shared variables. When a simple variable is used to model each wire of the netlist, each component model will always see the most recently written value. This style of modeling is beneficial for combinatorial networks, where there is no advantage gained from using signals.

FIG. 3 illustrates the swapover circuit again, but using this time variables instead of signals. The key to making it work correctly is that the models must themselves remember the previous value seen on their input and to use this old value when generating their output. In order that they can take note of the previous value, they must be called sufficiently frequently and there are various ways to ensure this, as we shall explain below.

Suitable pseudocode for the implementation of each flip-flop component model shown in FIG. 3 is as follows:

```
PROCESS DFF SENSITIVITY=(CLK)
    IF (CLK AND NOT OLD_CLK) Q = D
ENDPROCESS
REGARD DFF
    OLD_CLK = CLK
    OLD_D = D
ENDREGARD
```

Because signals are not used, each model must keep track of the old value on inputs to internal sequential circuitry. This is done by additional code inside each component model. The additional code is called the "regard routine", and this routine simply makes a note of pertinent inputs by keeping a copy of their value in variables local to the model. Below, the phrase "noting in a regard routine" will be used to refer to the practice of making a note of a value in a regard routine and then referring to the noted value instead of the original value in subsequent code.

The regard routine must be run after the main body of the software model has been run, but before inputs are changed to new values for the next cycle of operation. If there is only one such software model then the regard routine can be called and run at the end of the main process routine of the model, but when there are a number of software models interconnected by variables, all of the regard routines must be run after all of the process routines have been run.

In many essential ways, the step of running the union of the regard routines is like the commit phase when using signals. There are, however, various advantages of the approach using regard routines. One advantage is that it is relatively easy to automatically collect and place all of the regard routine code from the various models in one straight line subroutine that may be executed very quickly. Indeed a block copy may be used to take note of all the inputs. A block copy can be executed on a computer much more quickly that a complex series of tests and conditional stores required to dispatch all of the pending updates when using signals. This style of modeling is described in U.S. Pat. No. 6,606,734, referred to above.

The timing implications of using variables without pending updates to model sequential logic can be summarized as follows:
1. When a model is called and any clock inputs have changed in their active direction, external inputs that will be changing as a result of that clock edge may have updated values on their net. (Below, we call these "early inputs".)
2. When the model is called the new output values is written immediately and will be seen by any other models that have still to execute in the current delta cycle.
3. The union of the regard routines must be called, in any order, after all the process bodies have been executed, but before any external input values are changed.

SUMMARY OF THE INVENTION

The present invention provides a method for converting a program written in a hardware description language, such as Verilog or VHDL, to a program written in an alternative programming language, such as C, C++, Java or other object-oriented programming language, the alternative language program defining models with interconnections therebetween, the interconnections being represented by variables, wherein the method includes the step of modifying the models such that they are interoperable with a program in which the interconnections between models are represented by signals.

More particularly, the invention provides a method for converting a program written in a hardware description language to a program written in an alternative programming language, the alternative language program defining models with interconnections therebetween, the interconnections being represented by variables, wherein the method includes a step of modifying the models such that they are interoperable with a program in which the interconnections between models are represented by signals, by arranging for output interconnections of the models to refer to output values in such a way that the timing of the presentation of the output values on each output interconnection is consistent with the timing of the signal domain.

The invention further provides a method for modifying a program written in an object-oriented programming language such as C, C++, Java, the program defining models with interconnections therebetween, the interconnections being represented by variables, wherein the method comprises the step of modifying the models such that they are interoperable with a program in which the interconnections between models are represented by signals.

In particular, the invention further provides a method for modifying a program written in an object-oriented programming language, the program defining models with interconnections therebetween, the interconnections being represented by variables, wherein the method comprises the step of modifying the models such that they are interoperable with a program in which the interconnections between models are represented by signals, by arranging for output interconnections of the models to refer to output values in such a way that the timing of the output values on each output interconnection is consistent with the timing of the signal domain.

In this way, the method enables programs generated by systems in which internal timings are represented differently to interface correctly.

In a preferred implementation, the method also includes generating a wrapper file describing the interconnections between the model domain in which variables are used ("the variable domain") and the model domain in which signals are used ("the signal domain").

Preferably, the step of modifying the models comprises the steps of:
(a) marking early or late all interconnections in the variable domain;
(b) modifying any interconnections marked late in step (a) to refer to their current value rather than a noted value;
(c) making a note of any early values used by a function dependent on both early and late interconnections and modifying that function to instead refer to the noted values;
(d) determining those output interconnections from the variable domain to the signal domain which do not depend on noted values which are also depended on by parts of the variable domain other than outputs;
(e) processing the output interconnections identified in step (d) by modifying them to refer to their current value rather than a noted value;
(f) selecting and implementing a chase-out mechanism for each of the remaining output interconnections from either of:
   (i) arranging for the part of the program which creates the value on the output interconnection to be executed twice, the first execution being dependent on noted values and the second execution being dependent on current values; or (ii) copying the part of the program which creates the value on the output interconnection and modifying the copy such that it is dependent on current values.

Step (f) ensures that, where output connections from the variable domain depend on noted values on which parts of the variable domain other than outputs depend, the resulting tension in the chase-out process is resolved by creating two versions of the output which are dependent on noted and current values, respectively. The version dependent on current values is used as the output to the signal domain, and the other is used within the variable domain.

The step (f) may be implemented by duplicating the same code, or by arranging for a subroutine to be executed twice. Generally, the former is preferable due to the overheads associated with calling a subroutine.

In one particular implementation, step (a) comprises:
(i) marking all input interconnections to the variable domain as late;
(ii) marking all interconnections driven by edge detectors as early;
(iii) marking as late any interconnection not marked in steps a(i) or a (ii) which is a function of both early and late interconnections; and
(iv) marking as early any interconnection not marked in steps (a)(i) to (a)(iii) above.

It will be appreciated that marking interconnections late in step (iii) may well have implications for application of the same step to other interconnections, and so the step needs to be repeated until there are no further "knock-on" effects of this nature (often termed "closure").

For example, the tool used to create models in a variable domain is VTOC, and the tool used to create models in a signal domain with which the variable domain models are modified to interoperate is EDS.

The present invention also provides a computer program comprising program instructions for causing a computer to perform the methods described herein. The computer program may be embodied on a record medium, stored in a computer memory, embodied in a read-only memory, or carried on an electrical carrier signal, or other carrier.

The computer program may form part of a modified version of an existing tool, such as VTOC. Alternatively, it may be provided as an independently executable program for processing the output of an existing tool.

BRIEF DESCRIPTION OF THE DRAWINGS

Techniques of the prior art and embodiments of the invention will now be described by way of example and with reference to the accompanying schematic drawings, wherein.

DETAILED DESCRIPTION

Figure 4:
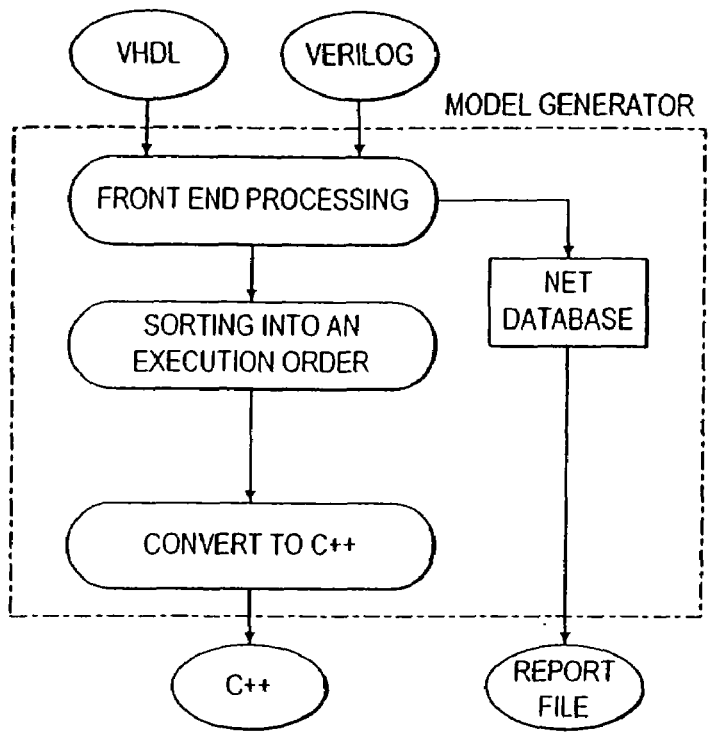
FIG. 4 shows a flow diagram representing the main steps in conversion of HDL to C++ using a version of VTOC existing prior to the present invention.

FIG. 4 shows the main stages in conversion of a program written in a hardware description language to C++ in an existing version of VTOC. The front end processing consists of parsing and type checking steps as performed by all compiler and software language systems. The nature of the input language, being an HDL, is that it will contain many nominal, parallel threads of execution that must be processed to achieve software execution on a single processor. Each thread will commonly be divided into an imperative basic block that can be run by a single thread without blocking.

The net database typically contains cross reference information about each net, including its style and location of definition and places where it is driven and used.

The box labeled 'sorting into an execution order' denotes operations connected with establishing the order that each imperative basic block shall be run at run time. This might be a single, monolithic wave of execution, with the order chosen entirely at compile time, or it might be more subtle, with blocks being arranged and sorted into smaller suborders with the flow between suborders, being selected at runtime according to the activity in the system.

The conversion to C++, or other software language, is relatively straightforward because the built-in operators in software languages, such as addition and comparison and function calling are very similar. However, a myriad of minor differences may need to be accounted for, such as overflow in fixed width fields and so on.

Figure 5:
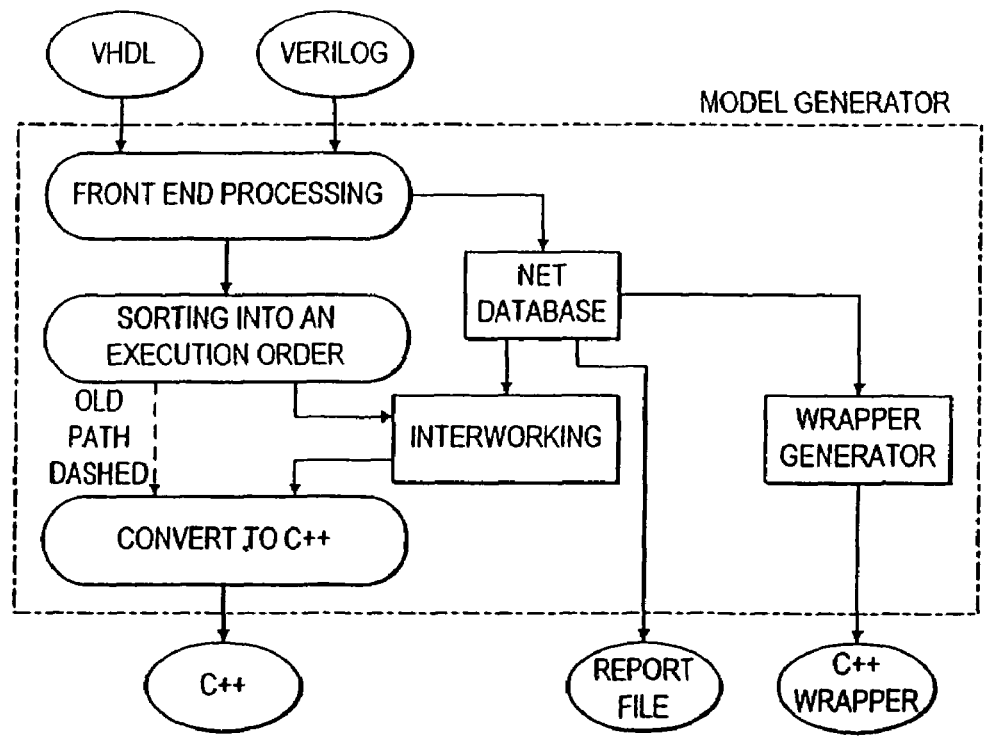
FIG. 5 shows a flow diagram representing the main steps in a process for converting HDL to C++ embodying the present invention.

The flow diagram of FIG. 5 illustrates a preferred embodiment of how VTOC may be modified in accordance with the invention such that the resulting C++ program is able to interoperate with a signal domain. It can be seen that a further process module "interworking" is included, which receives the output of the step of "sorting into an execution order", and modifies this output with reference to the net database. The output of the interworking step is then converted to C++. During the interworking stage, the software models are modified to reflect the differences in timing between signals and variables, as will be described in more detail below.

Preferably, the process also includes a wrapper generation phase. As shown in FIG. 5, this generates a "C++ wrapper" with reference to the net database. This wrapper or "shim" automates the "wiring" between the signal and variable domains. This wrapper appears to the signal system to be one or more conventional signal models, and hence contains the upcalls and their sensitivities to be registered with the signal domain scheduler.

Preferably, the wrapper is implemented as a class in an object-oriented software language (for example C++), and contains an instance of the software domain, as modified by the the interworking process.

The wrapper may be automatically generated from the net database or from a reconstructed net database made from report files when the originals software model was created. The particular details of the wrapper may vary according to the signal domain system used.

The automated generation of sensitivities may be achieved by first determining which of the input to the software model have the "clock property". The term "clock" is typically used by hardware engineers to denote a signal that causes clocked logic to advance in state. The broader term "clock property" is intended to encompass more signals than a hardware engineer might term as clocks. A net may be considered to have the clock property if a change in its value may cause a change in value of a state holding signal in the model. In hardware terms, this will tend to include asynchronous reset and preset input to flip-flops and potentially all input to level-sensitive latches. A state holding net may be defined as any internal net in or within a model that is read by the model before it is written into the model's process body.

Such a net is being relied on to retain its value, and hence state, from one execution of the process body to the next. Variables representing such nets can be identified by standard data flow analysis, as will be familiar to any writer of software compilers. For further details, see for instance, "Flow Analysis of Computer Programs" by Mathew S Hecht (1977) of "The Computer Science Library: Programming Language Series", published by Elsevier North Holland.

The software models need to be executed when an input has changed that might change internal state or when an input has changed that might have an effect on an output. These are inputs that have the clock property and/or inputs that have an event path through to an output terminal. The term "event path" is used to denote the normal hardware concept of combinatorial dependency, but also to include paths such as from the clock to Q of a flip-flop, that can carry an event, but which a hardware engineer would not term combinatorial.

To determine which signals possess the clock property, or possess event paths to an output terminal, conventional data flow analysis of the software model may be used, tracing data flow backwards from outputs and state-holding signals to the input connections of the software domain.

One approach is that a single, global sensitivity list may then be generated for that domain that consists exactly of the nets thus found.

The term 'target' is used herein to describe an output or internal probed or state net that is not used as an intermediate net for determining other targets. This term is used because it is the role of the software model to correctly maintain internal state nets, nets that the user has specifically requested to be maintained (because he is probing them with some diagnostic tool), and to generate outputs.

Rather than using only one sensitivity list and upcall per variable domain, efficiency can be improved in some cases if more than one upcall is placed at the disposal of the EDS core, each with a different sensitivity list and covering a different set of targets. These multiple sensitivity lists will, in general, each be a subset of original sensitivity list, and hence less likely to be activated. Each of the upcalls only contains certain parts of the whole model, and so can execute more quickly. Further, they can even be refined to take for granted that the events that cause it to run currently hold, and so do not need to be tested in the upcall code. For instance, an upcall that is executed only on the positive edge of a single net, such as an asynchronous reset or clock, can assume that that net is set to true.

The main advantage of having multiple upcalls occurs where certain input events tend to occur in isolation and only affect part of the model (i.e. the contents of the variable domain). Rather than having to execute the whole model when one of the isolated events occurs, only relevant parts of it need be run, saving time.

Whilst it may not be possible to choose the optimal partition of the variable domain into separate upcalls because the exact pattern of events that the model will encounter is not known. Certain partitioning steps are always sensible and others can be expected to help more often than not.

For example a group of targets that depends only on input events that are not used for anything else can be partitioned into a separate EDS upcall, and this is always likely to be worthwhile, unless the work involved is very small, in which case the EDS overhead may outweigh any advantage.

To approach this more generally, it is appropriate firstly to identify the target set T, the concourse sensitivity set S and the collection of all process bodies or separable imperative basic blocks C. For each target t in T, its sensitivity list can then be precalculated (using the clock property method) and the code c, a subset of C, required to propagate events from the input terminals to the target selected. A partitioning can then be formed with the following algorithm:

"while (T not empty) do
1. Select target t an element of T that has minimal sized code c_t;
2. Find all other targets that have the identical sensitivity s_t;
3. Create an upcall that executes the code for those targets and has sensitivity s_t;
4. Deleted those targets from T."

A potential problem of efficiency is that certain code may get placed in more than one upcall and so executed more than once. Thus, a refinement to the above algorithm may be, for instance, to afterwards merge all upcalls that share any code. This again is not optimal, because code may then be run when not needed.

A solution to this is to have more sophisticated guards in the sensitivity lists that can select to execute a merged or a selection of unmerged equivalents, according to the precise pattern of events present. This is beyond the common denominator of event facilities found across EDS hardware simulators, but certain systems may provide facilities that could be specifically used. In addition, it is possible to achieve the same effect with additional steering commands implemented as software if statements placed at the entry to the upcalls.

Figure 6:
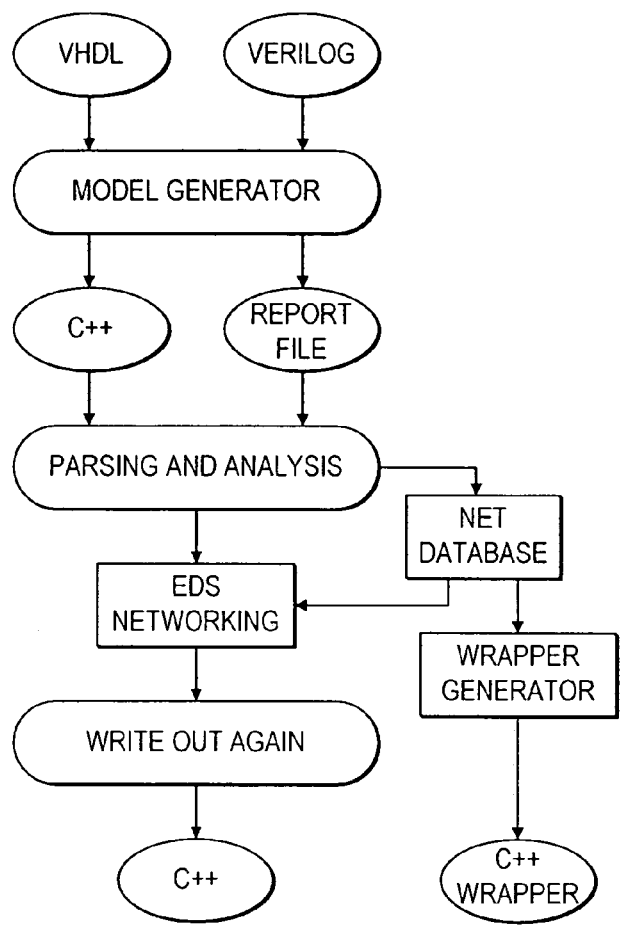
FIG. 6 shows a flow diagram representing the main steps in a process for modifying a program written in C++ to facilitate interworking.

FIG. 6 shows an implementation of the invention as a subsequent processing stage after the original models have been fully generated. This implementation has a disadvantage relative to that of FIG. 5 that the generated model must be parsed and analyzed before the interworking rewrites may be applied. There is also another, small overhead or writing out the model again.

Figure 7:
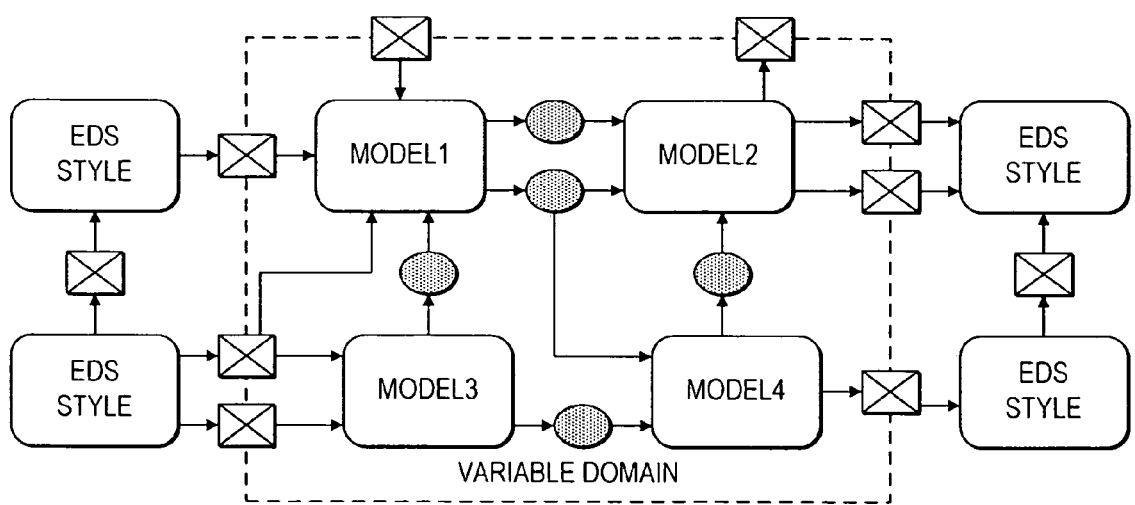
FIG. 7 shows a diagram representing interaction of models in signal and variable domains.

By way of illustration, FIG. 7 shows a representation of a system having both a signal domain and a variable domain. For the purposes of clarity, only a single variable domain is shown, although it will be appreciated that a system may include a plurality of variable and signal domains. Each variable domain may consist of any number of software models (transitively) interconnected by at least one variable.

All connections of the variable domain shown in FIG. 7 to and from the rest of the system are via signals. The invention facilitates modification of such a variable domain so that it correctly interworks with the immediately surrounding parts of the overall system. In FIG. 7, examples of the surrounding parts are represented by models denoted as "EDS style".

Any of the component models in the variable domain may consist of other component models, themselves interconnected with further, hidden variables. The level of visibility of component model boundaries within the domain need not affect implementation of methods described herein since, none of these methods are affected by the componentisation used, provided the edge-detectors remain recognizable.

Within the variable domain of interest, denoted with the dashed boundary in FIG. 7, for a given software model, certain inputs will be from variables and the remainder from signals. Equally, certain outputs will be to signals and others to variables. The normal operation of the signals is not affected, and so the software model will generate pending updates when it writes to the signals.

The nature of sequential logic is that it is sensitive to the order of events on its inputs. Where events arrive in the variable domain in separate EDS delta cycles and are processed separately, there is no problem on the input side: the model using variable will behave identically to the model using signals. On the other hand, where a "race condition" is present, there is a problem to solve.

A fundamental difference between signal and variable based modeling styles can be seen when a race condition is created. All good hardware designs avoid race conditions, but they may be encountered when implementing the present invention.

When both the clock and the data input to a D-type flip-flop are changed at the same time, a real flip-flop will behave in an uncertain way, since it might capture the old or the new value of the data input. This situation is known as a race.

An example of race conditions is crystallized in the following fragment of Verilog, In this fragment, a clock and a data wire are extracted from a two bit bus called IN. We extract them from the same bus to have a precise notion of what it means to change them both at once. On the positive edge of the clock wire, the eds_q signal is given a pending update of the D wire, according to the normal use of pending updates to model a D-type flip-flop. This update will later be committed by the Verilog core and become visible to readers of the signal.

```
wire clk, D;
assign {clk, D} = IN[1:0];
always @(posedge clk) eds_q <= D;
```

Figure 1:
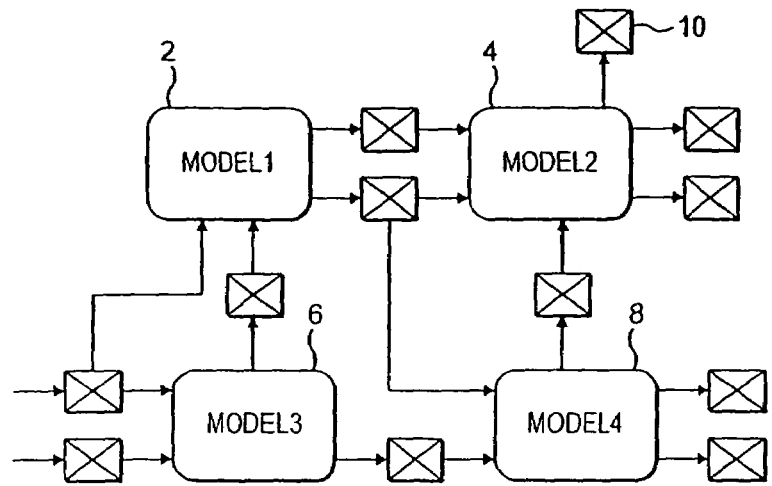
FIG. 1 shows a diagram representing software models and interconnections therebetween created as part of an EDS system.
Figure 2:
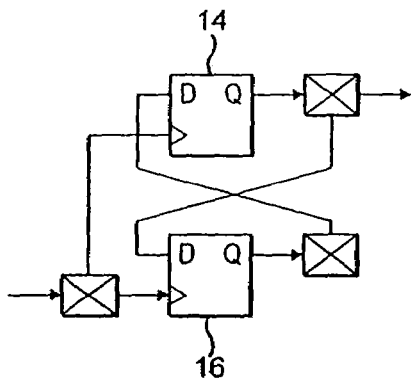
FIG. 2 shows a diagram representing a swapover circuit using signals to interconnect models.

As can be seen from the pseudocode for the signal-based flip-flop model given in relation to FIG. 2 above, and as will be well-known by one who is expert in the Verilog language, that pseudocode and this Verilog will exhibit the behaviour that the race is resolved by selecting the new value of the D input.

On the other hand, the following Verilog fragment implements the normal behaviour of a D-type flip-flop using a pair of transparent latches. This is closer in reality to the hardware circuit of an electronic D-type flip-flop, where the two latches are known as the master and slave.

```
wire clk, D;
assign {clk, D} = IN[1:0];
wire m = (~clk) ? D:m;
wire ms_q = (clk) ? m: ms_q;
```

Figure 3:
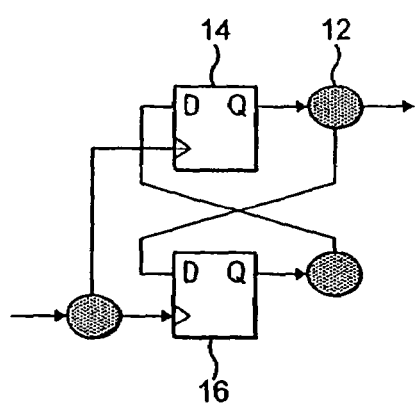
FIG. 3 shows a diagram representing a swapover circuit using variables to interconnect models.

The difference between the two models is that, at a race, when the clock changes from zero to one as D changes, the ms_q variable will be stored with the old value of D, whereas the eds_q signal, above, was given the new value of d. Analysis of the behaviour of the variable-based flip-flop model given in FIG. 3 reveals that it too resolves the race condition in the same way that the master-slave implementation of the D-type does.

As noted earlier, race conditions may occur in an efficient implementation of the present invention, even if they are absent in the hardware system being modeled. This is owing to a desire for efficiency. It is desirable to execute each model as infrequently as possible, which amounts to keeping its sensitivity lists to a minimum. Therefore, rather than executing the software model (including its regard routine) of a flip-flop when either the D or the clock input changes, it is preferable only to execute it when the clock changes, since this is the only input event that can cause an output event. The result of this optimization is that step of taking a note of the D input in the regard routine is wrongful when that D input has come in from an EDS signal. This can be seen in the following example, described with reference to FIG. 8.

Figure 8:
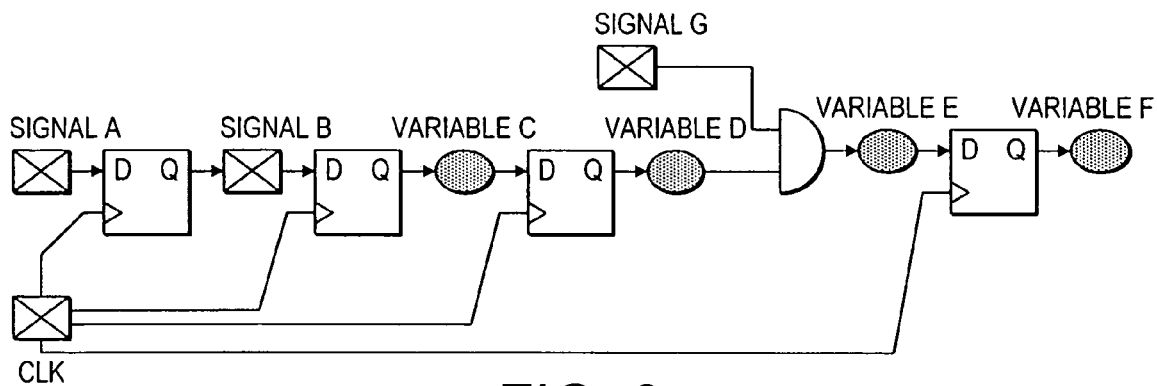
FIG. 8 shows a diagram representing a shift register structure which traverses a boundary between two modeling styles.

FIG. 8 shows a simple example circuit that is half implemented using signals and half with variables. The circuit is a commonly-found structure consisting essentially of a shift register. On the positive edge of the clock, the data should advance one stage in the shift register. For the shift register to operate correctly, the software model for the flip-flop that produces variable C needs to always read the current value in the signal B, rather than remembering the value of this input in a regard routine. In addition, there will be a timing disparity between the two inputs of the AND gate.

Automatic Modification of the Software Model

A preferred method for modifying, by rewriting, a software model, or set of models in a common variable domains, so that it may interwork with an EDS system will now be described. Within a variable domain, nets that are calculated as functions of any noted values of nets or any external inputs from signals are termed "late" whereas all other nets in the software model are termed "early".

We assume that there are no event or stimulus generators in the software model. Therefore, according to the above definition, all nets in the software model will be late by default. The exception is that any net that is conditionally assigned by an edge detector is always early. For example, the net Q in 'IF (CLK AND NOT OLD CLK) Q=D' will be early.

In summary, all variables in the domain are marked either early or late. The rules for marking them have just been given, but further detail will be given below for the situation where a net is calculated as a function of both early and late nets, for instance an ANDing of early and late nets. The resulting net will indeed be late, but special handling of the early input(s) is needed, and this special handling may also finally be eliminated for "chase-out" handling as also described later.

The term "net" is used to denote either a signal or a variable. The term "function" should be taken to mean not just a subroutine call, but also use of any built in operator such as addition, array subscription or exclusive-or, or any arbitrary code that computes a result based only on input values.

Figure 9:
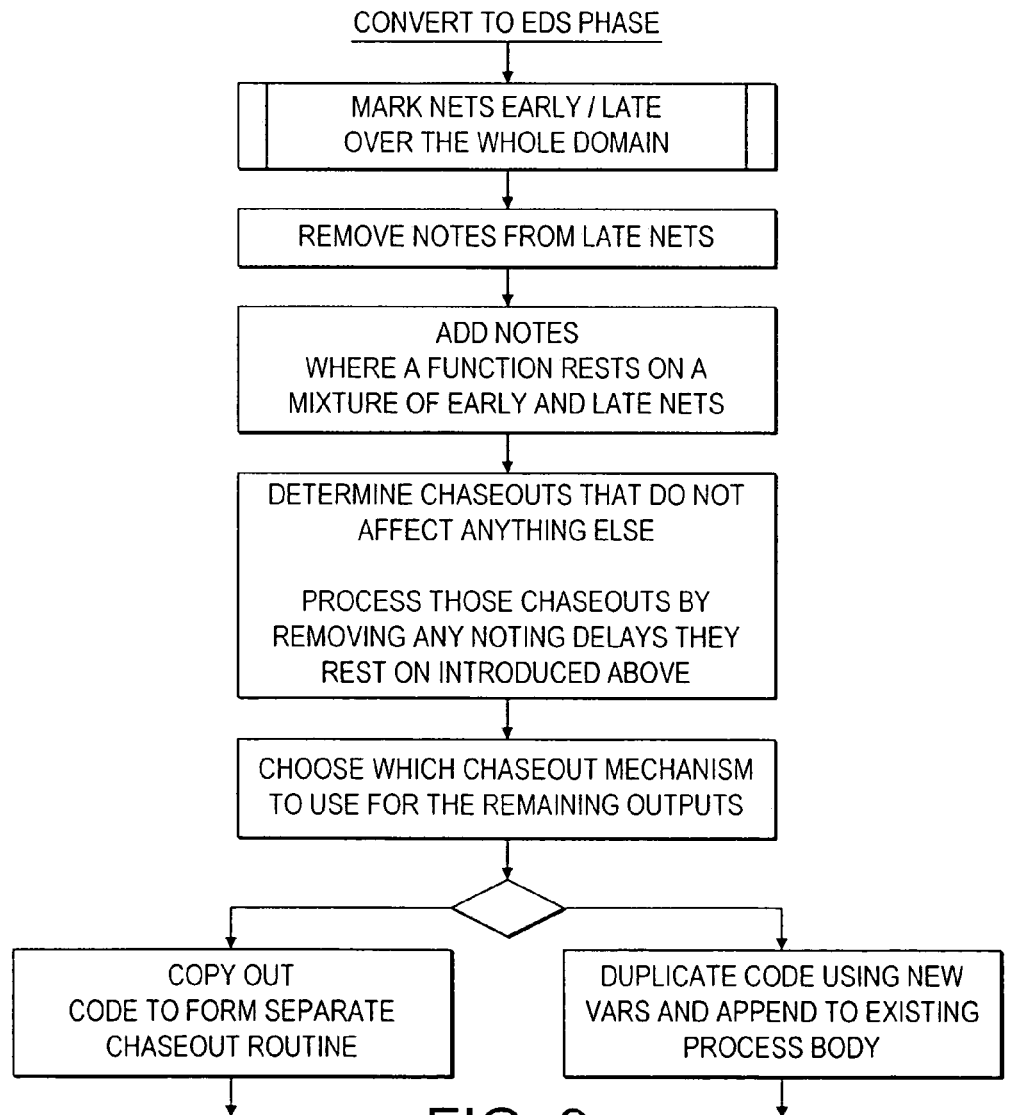
FIG. 9 shows a flow diagram illustrating steps in a method for modifying a software model using variables to facilitate interworking with a signal domain.

An embodiment of a method for modifying, by rewriting, a software model, or set of models, in a variable domain so that it, or they, may interwork with a signal domain is shown in FIG. 9.

Preferred steps within the stage "mark early/late over the whole domain" are as follows:
1. Mark all input terminals late;
2. Mark all nets driven by edge detectors early;
3. Repeatedly mark late any unmarked variable that is a function of mixed early and late nets until no further unmarked variables exist; and
4. Mark all the remaining nets early.

The stages shown in FIG. 9 will now be described in more detail.

By way of an initial illustration, in FIG. 8, the variable C is early because it is assigned from a statement that is sensitive to an edge. In general, such a variable may have other assignments, perhaps from asynchronous reset or preset conditions, but the presence of these would have no effect on our interpretation of the variable as early. Intuitively, the variable is early because in the EDS-equivalent code, it would be a signal and the value read out of it would not be visible until later, after the next commit phase, but because the model is using variables, the value is visible early.

By these rules, in FIG. 8 variables C, D and F are early because they are assigned using edge detectors, whereas variable E is late because it is a function of a signal.

Except for outputs from the variable domain (which are considered below), two rules of rewriting are required:
1. Where a late net is noted in a regard routine, remove all references to the noted value from the code, using instead the un-noted original value at these places of reference, thereby making the noted value redundant and removable.
2. Where a function is formed of early and late nets, implement additional notes of all used early nets and use the noted values as inputs to the function instead. The function will thereby be entirely calculated on late values and the result is thereby late.

These rules both act to rewrite the code. For example in FIG. 8, all flip-flops would have been originally generated to use the noted values of their D inputs. Rule 1 causes the first and last flip-flop to be modified not to use these noted values, but to use the current input value directly, since, for both these devices, the D input is late. The second rule causes a rewrite of the model for the AND gate so that instead of referring to variable D directly, it creates an entry in a regard routine (if one does not exist already) for variable D and refers to the noted value instead.

Therefore application of a method embodying the invention to internal nets firstly scans though all of the internal nets marking them early or late and then to make the rewrites required to correct the timing. It is assumed that the original software model has been created in an automated way using only a few variations in coding style, and so a set of automated rules that implement the rewrite is relatively straightforward to produce.

On the other hand, if the invention is embodied by a processing stage of the tool that generated the original software model, and so the vocabulary of coding styles that must be matched during the rewriting stage is to hand, the implementation task is more readily achieved.

Although the examples above are simple and do not involve gated or derived clocks or level-sensitive latches, these rules are phrased to be sufficient to handle software models of many common structures.

An informal explanation of the rules can now be given.

The first rule removes the delay introduced by noting a net when that net is already delayed though having passed through the evaluate/commit delay intrinsic to signals.

The first rule may also be paraphrased as effectively saying it is not necessary to note a late net in a regard routine as the updated value is not available. The updated value is the value that would/should be noted, but it is not available, being still held inside the signal. One could also say it is not necessary to note it because it is "already late" and further noting is likely to add unnecessary delay.

The second rule adds one or more noting delays that equalize the delay paths on the various inputs to a function.

Discussion herein concerning variables that represent simple nets also applies to array variables. Application of these rules to arrays can create unnecessary work, that can be avoided by the optimization presented in this section.

Consider a read of an array that has an edge-triggered write. This is illustrated in the following fragment of Verilog, where the array is written at location I with E on the positive edge of a clock and is also subject to a read operation at a location J. We note that, in general, at model generation time, it is impossible to tell whether I and J will ever be equal at model execution time.

```
always @(posedge clk1) begin
    A[I] < = E;
    Q < = A[J];
end
```

If expression J is late, our second rule suggests that the whole of the array needs to be noted. A more efficient solution is to note only A[J], but to do this before the update of A[I] can occur. Unlike other noting operations, this obviously cannot be done in a regard routine run after all other activity, since the other activity includes the update of location I.

To use this optimization, we require there to be a suitable gap between the chosen ordering of execution of process bodies within the variable domain. Into this gap we place the required noting. Implementation of this optimization may not always be possible when modifying an existing software model, because there may be no suitable gap. On the other hand, if the generator of the software model had advanced warning of this requirement, as would be the case when the invention is implemented by a processing stage in the generation of the software model to start with, then preferably the generator should take this constraint into account to provide a suitable point for the noting operation.

Rewriting Rules for Outputs

Outputs from the variable domain must be fed back into the EDS system, again normally using signals. Although there may be "backdoor" methods of sending output into specific EDS systems, the method common to the majority of EDS systems is to use signals. The present method seeks to ensure that the required output values from the variable domain will all be sitting in known variables and then to use a "chase-out" to copy these values into the EDS signals.

The method of generating signal assigns varies greatly in detail depending on the particular EDS being used. For example, under SystemC each of the output nets must be stored in a SystemC signal variable in turn, using a list of C++ assignments. Again, as a second example, in the Verilog PLI interface, a specific subroutine provided in the PLI library must be called for each output signal.

Whichever detailed method is used, in implementing the present invention, the necessary operations are preferably placed in a collection of chase-out routines. The set of regard routines shares a common property with the set of chase-out routines: the allocation of work between routines in a set is quite arbitrary and a matter of convenience at code generation time and all of the required work can be done in any order.

Figure 10:
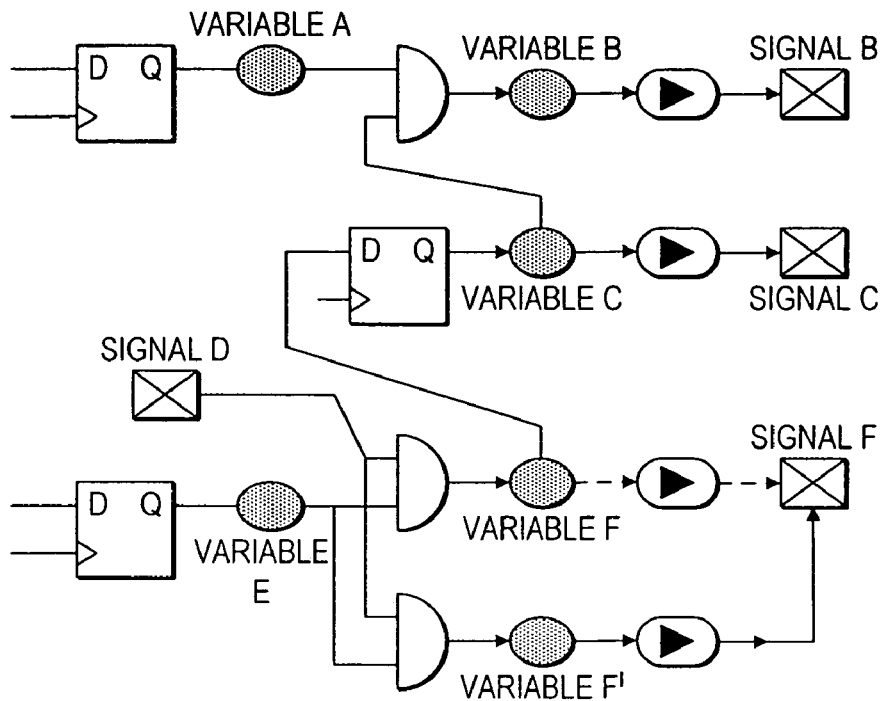
FIG. 10 shows a diagram illustrating structures feeding output from a variable domain to a signal domain.

To implement the chase-out of an early net, it is written to the associated signal. This is illustrated in FIG. 10 where the chase-out copies of early variables B and C are denoted as an oval with an arrow inside. The chase-out phase copies these two early values to their associated signal in the EDS world.

The one subtlety of generating output is that certain of the values to be fed out may also be required internally to the variable domain as inputs to sequential logic. This is not uncommon in general hardware designs. The timing requirements on these two values can vary, in which case there are two possible solutions: the first solution is to duplicate the required logic, with one copy using a different timing from the other, and the second solution is to use one copy of the logic, but partition it into subroutines so that it may be called twice, once for the internal processing of the model and other to execute the chase-out.

This situation is illustrated with variable F in FIG. 10. This variable requires a chase-out to signal F, but it is also used for a non-output purpose as the D-input to the C flip-flop. Variable F would be marked late since it is a function of signal D, and hence the AND function would use the noted value of E.

However, for the chase-out, the correct solution is not to use the noted value of E. Hence the Figure shows two versions of F, called F and F'. The chase-out copy of F is shown dotted, since it cannot be used. Instead, a copy of the AND gate, called F' is made, that does not use the noted value of its support, and it is F' that is copied to EDS in the chase-out.

As noted, an alternative implementation of this, that might be preferable when duplication of code produces an inefficient solution, is for the code for F to be run again after the regard routine has copied E to its noted value, and for the chase-out of F to be executed thereafter. In this case, a new variable F' would not be required.

To formalize this as rewrites rules, a first rule for chase-out of late nets is:

CO1. Where a function needed for an output signal combines the noted version of an early net with a late net to generate a new late net, use the un-noted original version instead.

This rule CO1 undoes the second of our main two rewrite rules, introduced above. It may be used only if none of the modifications it makes to the model affects a variable that is used for anything other than an output to the EDS. This fact can readily be determined using conventional dataflow analysis of the program.

Where this side condition does not hold, that is, where a value to be outputted is also required within the variable domain, then the code is duplicated so it has its own private copy to work on, or else execute the same code twice:

CO2a. Where rule CO1 would affect nets that are not used entirely for generating output to the EDS (e.g. they are used to update internal state, as defined below), then the code to be rewritten should be duplicated with one copy being used for the output and one copy for the other purposes. Rule CO1 may now be applied to the copy used for output.

The duplicate copy of the code can be placed alongside the original copy, to be evaluated immediately before or after, using fresh variable names for the variables that are updated.

Alternatively, the code can be copied into the chase-out procedure and where it can run at chase-out time using the original variables since the values in these variables will no longer be needed by the software model.

CO2b. Where modifications from rule CO1 would affect nets that are not used entirely for generating output to the EDS, then the code to be modified should not be modified but instead be re-executed at chase-out time followed by any other code that is needed to chase-out the events held in the noted nets to the output terminals.

An informal explanation of this rule can now be given. The rule removes a noting delay that would be implemented as an evaluate/update delay with a signal in the equivalent EDS design. However, in the EDS design, the part of the model beyond the signal would be made sensitive to the signal and be executed in a subsequent delta cycle, but this sensitivity and automatic delta cycle is not present when using variable domains. The solution of re-executing that part of the code beyond the signal is directly equivalent to running the extra delta cycle. The solution of missing out the delay, provided that the net in question is only used for output, is equivalent to running the subsequent, fictional delta cycle straightaway without adverse consequence.

Level-Sensitive State Elements

Figure 11:
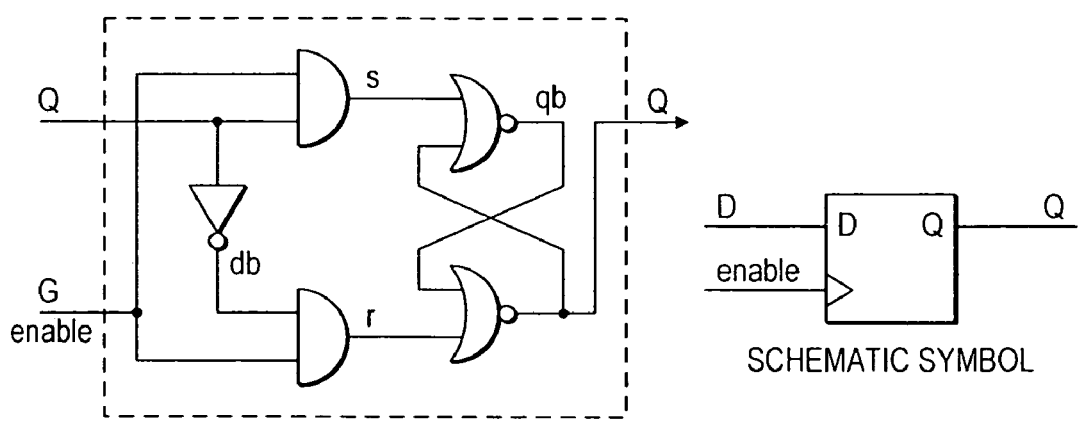
FIG. 11 shows a diagram and symbol, each representing a transparent latch.

Many circuits contain transparent latches, RS latches or other state-bearing subcircuits composed of feedback between primitive gates. These circuits are sensitive to the order of events on their inputs. For instance, considering the transparent latch illustrated in FIG. 11, when starting with both inputs at logic one, and moving to a situation where both inputs are zero, the latch will end up holding a different value depending on the order of events on the inputs. Note that there may be more than two inputs to a level sensitive latch.

A good hardware design will avoid changing a pair of order-sensitive inputs at once, since real hardware behaves unpredictably under a race condition. However, an EDS model of a component may experience this situation because careful design of the overall model has reduced delta cycle frequency causing races that did not occur in the real hardware. The model, in these circumstances, is also programmed internally to handle the race in the desired, predictable manner.

Such components do not contain edge-detectors and may be treated by this invention as any other logic function: if all inputs are early then there is no action from the rules and the output is early; if all inputs are late, then there is no action from the rules and the output is late; and if the inputs are mixed, the early ones are noted and the noted values are used instead, thereby creating a late output. This behaviour is correct on the whole and there is only one special case to consider.

Of the two methods of handling chase-outs described, the method of re-executing certain parts of the system raises no problem when there is a state-bearing latch on the output path. This latch will see the same order of events on its inputs as normal and update the original state-bearing variables with any state changes. On the other hand, the short-cut method, implemented by rule CO1, will cause inputs that are no longer noted to change earlier than the other inputs. This has the potential to convert a race condition to a non-race condition, which in general is desirable. However, in the highly unlikely case that the design relied on the race in combination with the efficiency reason given earlier then an implementation of the present invention may introduce a possible difference between the unmodified software model and the model modified for EDS interworking. If desired, this situation can be detected and flagged to the user or otherwise detected and forced to the re-execution solution.

Sensitivities

As noted above, the concept of "sensitivities" is an integral part of EDS. Sensitivities are the means by which a system knows when to run each routine. Routines may be run more frequently than necessary if more than the essential sensitivities are provided, but this is inefficient. On the other hand, errors arise if code is not run sufficiently frequently and so sensitivities are an important factor.

Under EDS, for efficiency, any component model can typically specify to the simulator core which subroutines of the model to call when listed patterns of events are detected on given inputs nets. For example, a model for a D-type flip-flop might register a single subroutine that is called only on the positive edge of its clock net, since this is the only external event that will cause it to do any work. If it has an asynchronous clear, it might register another subroutine to be called when the clear net changes value.

In the most general case, however, a model might register just one single subroutine to be called for any change on any sort on any of its nets. Even so, there is no guarantee it will be called for every separate change on every net: several nets may have committed updates and changed at one time before the subroutine is called. If a net is changed and then changed again back to its original value before the call is made, then the model will see no change. This sequence is known as a 'glitch' and all sensible hardware designs are structured such that missed glitches are of no consequence, so glitches are not considered further here.

The unmodified software model that is the input to a method embodying the invention must also have associated rules about when to call its subroutine(s). As described above for EDS, there are many variations in possible detail, but broadly, a subroutine must be called when its input nets have changed and it in turn will change other nets that are inputs to other subroutines. It is the role of the software model to correctly maintain internal state nets and generate outputs. It may also have the job of correctly updating the state of certain internal nets that the user is probing or monitoring, given that notification of these nets is somehow made available to our process, such as through a command line flag. As noted above, the term 'target' is used to describe such an output or internal state net or probed net that is not used as an intermediate net for determining other targets. The said subroutine(s) will therefore inevitably be structured to support a wave (or multiple waves) of events that traverse the nets, starting from one or more inputs and ending at one or more targets.

By way of illustration, an example of a sensitivity mechanism that enables the modified model to be registered with the EDS system will now be described, but it will be appreciated that various refinements/modifications of the model may be possible.

In the model to be considered, the process bodies of all the software models in the variable domain are sorted into an order that sweeps events through. In computer science terms, this amounts to choosing a complete ordering from a partial ordering or directed acyclic graph (DAG). If the graph does indeed have one or two cycles, owing to combinatorial feedback between the component models, then a solution to unwind must already have been provided by the supplier of the unmodified model (see U.S. Pat. No. 6,606,734) and so it may be assumed that all of the models can be executed in an order that sweeps any event from any input to any output by calling the models in the prescribed order.

After calling the models, we execute all of their regard routines in any order. Finally we execute all of their chase-out routines, in a suitable order. The order of the chase-out routines will be a suborder of the ordering of their process routines, since the same ordering constraints apply. The combined calling of all of these subroutines in the chosen order may be termed a model "step". The step can be implemented by a subroutine that calls all of the other subroutines in turn.

The step routine itself can be registered as an EDS upcall made sensitive to all of the inputs of the model. This would be wasteful where inputs arrive staggered over multiple delta cycles and it is known that inputs arriving within a given time margin of each other should be considered synchronized. Therefore, an auxiliary routine may be implemented which is sensitive to all relevant inputs and which schedules a control event to occur a short time later than the current input change. Further input changes are ignored until the step routine has been triggered by its sole sensitivity to this control event.

Figure 12:
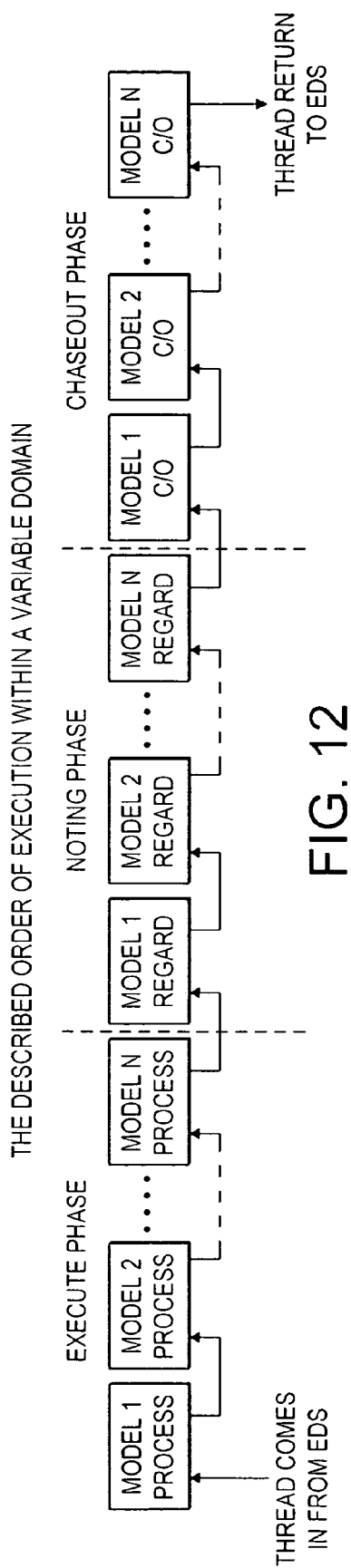
FIGS. 12 and 13 show flow diagrams representing order of execution of code generated in accordance with the present invention.
Figure 13:
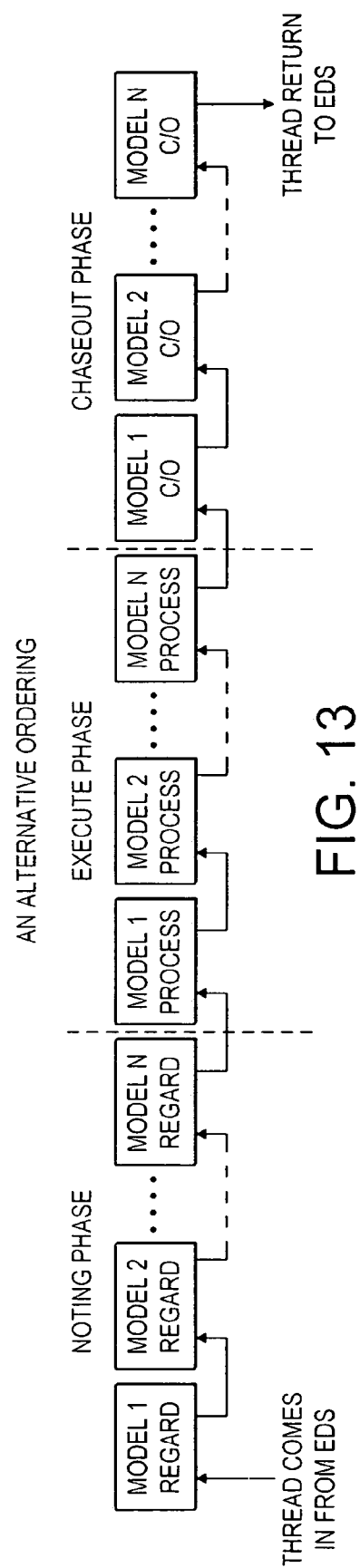

FIG. 12 shows a preferred order of execution within a variable domain, and an alternative order is shown in FIG. 13.

Although the FIGS. 12 and 13 show a chase-out routine for every component, many of the components can be said to be 'buried' in that they do not contribute directly to any output events. Buried components have no direct connections to outputs to EDS and all of their own outputs pass through edge detectors in other components before affecting an EDS output. Clearly, such buried components will not require a chase-out routine.

FIG. 13 illustrates an alternate calling order where all of the noting ('regard') routines are called before any of the process bodies. The chase-outs in this case are still run after the process body, but in order to work correctly they must either be of the form that uses fresh variables or else they will additionally have to include the step of updating the relevant noted values themselves.

Figure 14:
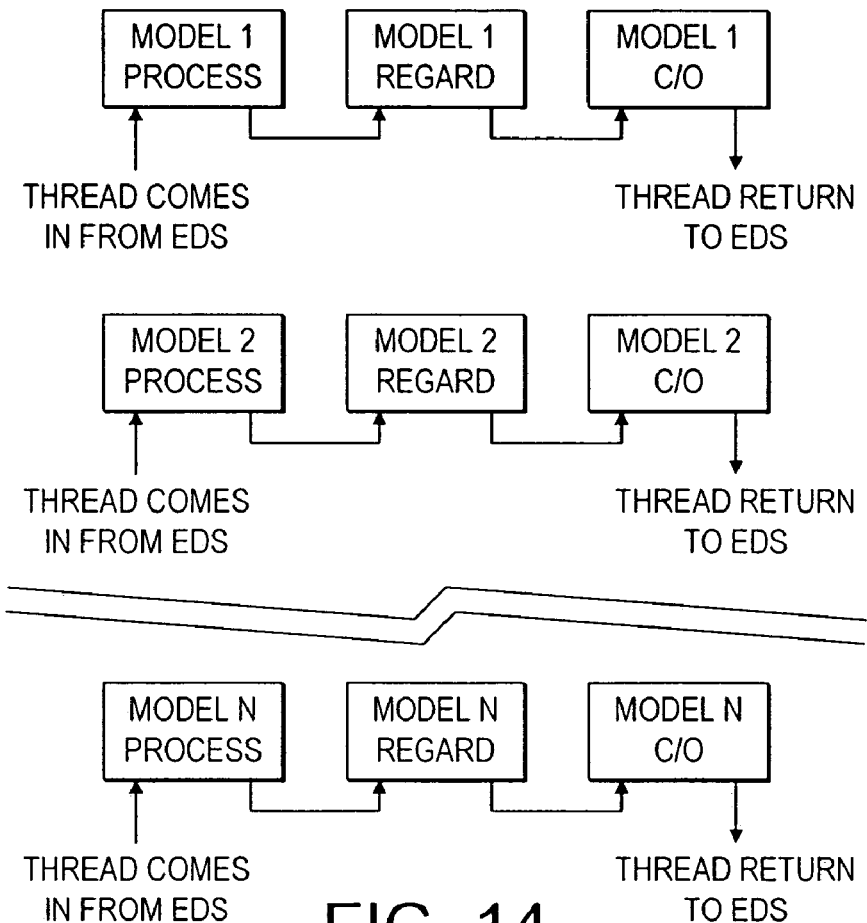
FIG. 14 shows a diagram of an exemplary circuit using both signals and variables.

FIG. 14 illustrates the basic idea of multiple upcalls from the EDS system. It shows exactly one component per upcall, but as mentioned earlier, there are no hard and fast component boundaries and each of these components could correspond to several components in the original, thereby giving a seamless spectrum of implementation styles from a single upcall to potential a greater number of upcalls than original components in the design.

In general, any hybrid of these calling orders can be formed, where certain variables are noted before process execution and other after. Such hybrids may be useful in certain applications, for instance, where it cannot be known in advance whether a connection is to be EDS or another variable domain, or where the total amount of code is minimized by choosing an appropriate hybrid.

In SystemC, for example, the sensitivities and upcall will be realized with the following code:

```
sc_event callback;
bool notifying;
SC_CTOR(VDOMAIN)
{
    notifying=0;
    SC_METHOD(drive_callback);
    sensitive< <clk; // and so on...
    SC_METHOD(drive_model);
        sensitive< <callback;
};
void VDOMAIN::drive_callback( )
{
```

```
            if (!notifying) callback.notify( SC_ZERO_TIME );
            notifying = 1;
        }
    void VDOMAIN::drive_model( )
    {
    notifying=0;
    model.process( );
    model.chaseout( );
        model.regard( ); }
```

This code fragment operates by providing a very small subroutine, called 'drive_callback' sensitive to all of the inputs to the variable domain. This uses a SystemC event to record that the domain requires execution. The constant 'SC ZERO TIME' sets the delay within which staggered arrivals are considered synchronized. The subroutine 'drive_model' is called when there have been no events on the input signals for the delay time.

Variations

As in all software programming, various permutations in the ordering of operations are possible without altering the behaviour of the program. It will be appreciated that numerous small variations fall within the scope of the present invention. Some of permutations and variations are discussed below.

Where a function, such as an AND gate, has its output noted, a modification to the program that does not alter the behaviour of the program is to note the inputs instead. This modification can be applied repeatedly, each time moving the noting operations backwards in the signal flow. This backwards migration can proceed no further when the noting operation is performed on an external input or the output of an edge detector. Where the function is actually a level-sensitive latch structure, this is of no consequence, except that the latch will be updated one step later, and this difference would only be manifest if an external software 'probe' was monitoring the state of the latch. The use of such probes is likely, so preferably, this modification should not be performed when the function is known to be a probed latch. One motivation for migrating the noting functions around is that their total number might be reduced, thereby reducing the work performed in regard routines.

Another, related permutation to the methods described herein is to run the regard routines at the start of the upcall from the EDS layer instead of last of all: i.e. at the start of the step routine as shown in FIG. 13. This only makes a difference to external inputs from EDS that are noted in the regard routine. The effect of any direct noting of external inputs would be entirely eliminated by such an ordering. In combination with the above-mentioned backwards migration, any noting required of external inputs is direct. By "direct" is meant that it is the input signal that itself is noted and not a derived function of it. For simple designs where all the clocks and other edge-detected nets are sourced externally, this transformation has the exact equivalent effect as our main the rewriting rules noted above, but without needing to consider whether nets are early or late. In broad terms, the backwards migration removes the noting at the input to the flip-flop, which is what the first rule does, and the places new notings earlier on in the circuit flow, which is what the second rule does. Backwards migration will tend to increase the quantity of code that must be processed for chase-out, and so, although this variation may be useful to reduce model size, moderation is required in its application.

Figure 15:
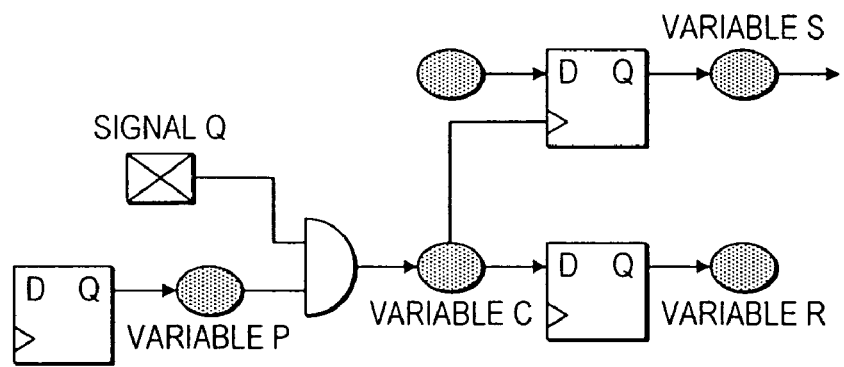
FIG. 15 shows a diagram of an exemplary circuit where backwards migration of noting delays cannot be applied.

Backwards migration of noting delays cannot be applied where a net is a combinatorial function of an external signal and internal state and is used both for the next state of one clock domain and as a derived clock for another clock domain. An example circuit is shown in FIG. 15. In this circuit, to migrate the noting delay of flip-flop are backwards so that it sits on the output would delay clocking of flip-flop S.

Specialised Behaviour of Verilog

Of the three main EDS systems in use in today, Verilog has a more complex simulation cycle than the other two: VHDL and SystemC. In essence, as well as signals Verilog has variables. Actually, the difference is not in the declaration of the nets but in the operator used to assign to them. Verilog has a pair of behavioural assignment operators called blocking and non-blocking. Within a module, the difference in behaviour is apparent but Verilog also implements a signal-style delay for nets leaving a module and interconnecting to other modules.

At first sight, one might consider that the chase-out mechanism is not needed when interworking with a Verilog EDS, because the output copies can be implemented as blocking rather than non-blocking assigns. However, where an early signal is combined with a late signal in a function to produce an output, chase-out action is still required, and so the use of blocking assigns for chase-out would not be a complete solution. In addition, one has to consider that the manifestation of each output copy operation is as a call to the Verilog PLI library, and there is little benefit in changing from one type of call to another.

Conclusion

The present invention seeks to facilitate interoperation between software models using variables for section interconnection on the one hand, and conventional EDS simulation using signals on the other. In order to plug a software model using variables into an EDS testbench, certain nets must be treated as "late" by the software model in order for the correct data synchronization to be always achieved. Equally, "chase-outs" are needed to push events into the EDS world that could otherwise be left alone in a pure software model. Finally, a method is described for generating sensitivities for the software model to register with the EDS core and batching of events so that the software model is not executed more frequently that strictly necessary.

Programs Embodying the Present Invention

Filed herewith are two identical discs, each containing a product release of a program embodying the present invention for use on an x86 processor running Linux RedHat 7.3 or 8.0, with GCC Version 3.2 or later.

The invention claimed is:

1. A method for converting a first program written in a hardware description language to a second program written in an alternative programming language, the first program defining models with interconnections therebetween, the interconnections being represented by variables, wherein the method includes a step of modifying the models such that they are interoperable with the second program in which the interconnections between models are represented by signals, by arranging for interconnections of the models in the first program to refer to values in such a way that a timing of the presentation of the values on each interconnection in the first program is consistent with a timing of a signal domain in the second program, wherein the step of modifying the models comprises:

(a) marking early or late all interconnections in a variable domain;
(b) modifying any interconnections marked late in step (a) to refer to their current value rather than a noted value;
(c) making a note of any early values used by a function dependent on both early and late interconnections and modifying that function to instead refer to the noted values;
(d) determining output interconnections from the variable domain to the signal domain which do not depend on noted values which are also depended on by parts of the variable domain other than outputs;
(e) processing the output interconnections identified in step (d) by modifying them to refer to their current value rather than a noted value and;
(f) selecting and implementing a chase-out mechanism for each of the remaining output interconnections from either of:
  (i) arranging for the part of the program which creates the noted value on the output interconnection to be executed twice, the first execution being dependent on noted values and the second execution being dependent on current values; or
  (ii) copying the part of the program which creates the noted value on the output interconnection and modifying the copy such that it is dependent on current values.

2. The method of claim 1 wherein the step of modifying the models further comprises the step of generating a wrapper file describing the interconnections between the variable domain and the signal domain.

3. The method of claim 1 wherein step (f)(i) comprises duplicating said part of the first program.

4. The method of claim 1 wherein step (f)(i) comprises arranging for a subroutine to be executed twice.

5. The method of claim 1, wherein step (a) comprises:
  (i) marking all input interconnections to the variable domain as late;
  (ii) marking all interconnections driven by edge detectors as early;
  (iii) marking as late any interconnection not marked in steps (a)(i) or (a)(ii) which is a function of both early and late interconnections; and
  (iv) marking as early any interconnection not marked in steps (a)(i) to (a)(iii) above.

6. The method of claim 1 wherein models in a variable domain are created using VTOC.

7. The method of claim 1 wherein models in a signal domain are created using EDS.

8. The method of claim 1 wherein the hardware description language is Verilog or VHDL.

9. The method of claim 1 wherein the alternative programming language is an object-oriented programming language.

10. The method of claim 1 wherein the alternative programming language is C, C ++, or Java.

11. A computer storage device containing computer-executable instructions, which when executed by a processor, cause the processor to perform the method of claim 1.

12. A method for modifying a first program written in an object-oriented programming language, the first program defining models with interconnections therebetween, the interconnections being represented by variables, wherein the method comprises the step of modifying the models such that they are interoperable with a second program in which the interconnections between models are represented by signals, by arranging for interconnections of the models in the first program to refer to values in such a way that a timing of the values on each interconnection in the first program is consistent with a timing of a signal domain in the second program, wherein the step of modifying the models comprises:
  (a) marking early or late all interconnections in a variable domain;
  (b) modifying any interconnections marked late in step (a) to refer to their current value rather than a noted value;
  (c) making a note of any early values used by a function dependent on both early and late interconnections and modifying that function to instead refer to the noted values;
  (d) determining output interconnections from the variable domain to the signal domain which do not depend on noted values which are also depended on by parts of the variable domain other than outputs;
  (e) processing the output interconnections identified in step (d) by modifying them to refer to their current value rather than a noted value and;
  (f) selecting and implementing a chase-out mechanism for each of the remaining output interconnections from either of:
    (i) arranging for the part of the first program which creates the noted value on the output interconnection to be executed twice, the first execution being dependent on noted values and the second execution being dependent on current values; or
    (ii) copying the part of the first program which creates the noted value on the output interconnection and modifying the copy such that it is dependent on current values.

13. The method of claim 12 wherein the step of modifying the models further comprises the step of generating a wrapper file describing the interconnections between the variable domain and the signal domain.

14. The method of claim 12 wherein step (f)(i) comprises duplicating said part of the first program.

15. The method of claim 12 wherein step (f)(i) comprises arranging for a subroutine to be executed twice.

16. A method of claim 12, wherein step (a) comprises:
  (i) marking all input interconnections to the variable domain as late;
  (ii) marking all interconnections driven by edge detectors as early;
  (iii) marking as late any interconnection not marked in steps (a)(i) or (a)(ii) which is a function of both early and late interconnections; and
  (iv) marking as early any interconnection not marked in steps (a)(i) to (a)(iii) above.

17. The method of claim 12 wherein models in a variable domain are created using VTOC.

18. The method of claim 12 wherein models in a signal domain are created using EDS.

19. The method of claim 12 wherein the object-orientated programming language is C, C++ or Java.

20. A computer storage device containing computer-executable instructions, which when executed by a processor, cause the processor to perform the method of claim 12.

* * * * *